(12) United States Patent
Maile

(10) Patent No.: US 6,881,688 B2
(45) Date of Patent: Apr. 19, 2005

(54) METHOD OF FABRICATING A VERTICALLY PROFILED ELECTRODE AND SEMICONDUCTOR DEVICE COMPRISING SUCH AN ELECTRODE

(76) Inventor: Bernd E. Maile, Vorderer Berg 9, 89186 Illerrieden (DE)

(*) Notice: Subject to any disclaimer, the term of this patent is extended or adjusted under 35 U.S.C. 154(b) by 0 days.

(21) Appl. No.: 10/323,817

(22) Filed: Dec. 20, 2002

(65) Prior Publication Data

US 2003/0153178 A1 Aug. 14, 2003

(30) Foreign Application Priority Data

Feb. 5, 2002 (EP) .......................................... 02001998

(51) Int. Cl.$^7$ .............................................. H01L 21/00
(52) U.S. Cl. ...................... 438/951; 438/948; 438/945; 257/284
(58) Field of Search ................................ 438/951, 948, 438/945, 950, 949; 257/284, 622

(56) References Cited

U.S. PATENT DOCUMENTS

| | | | |
|---|---|---|---|
| 4,238,559 A | | 12/1980 | Feng et al. |
| 4,373,018 A | | 2/1983 | Reichmanis et al. |
| 5,053,348 A | * | 10/1991 | Mishra et al. .............. 438/571 |
| 5,370,973 A | | 12/1994 | Nishii |
| 5,593,917 A | | 1/1997 | Nuyen |

FOREIGN PATENT DOCUMENTS

| | | | |
|---|---|---|---|
| EP | 0 718 877 A2 | 6/1996 | |
| EP | 0 978 869 A2 | 2/2000 | |
| JP | 4-177738 | 6/1992 | |
| JP | 05-090300 A | * 4/1993 | ......... H01L/21/338 |

OTHER PUBLICATIONS

Hoole et al., "Negative PMMA as a high–resolution resist—the limits and possibilities", Semicond. Sci. Technol., vol. 12, pp. 1166–1170, 1997.*

Falco, C.M.J.M. van Delft et al., Hydrogen silsesquioxane/novolak bilayer resist for high aspect ratio nanoscale electron–beam lithography, J. Vac. Sci. Technol. B 18(6), Nov./Dec. 2000, pp. 3419–3423.

Maile, B.E. et al. Sub–10nm Linewidth and Overlay Performance Achieved with a Fine–Tuned EBPG–5000 TFE Electron Beam Lithography System, Dec. 2000, Jpn. J. Appl. Phys., vol. 39 (2000), pp. 6836–6842.

Maile, B.E., Fabrication limits of nanometer T and gates: Theory and experiment, J. Vac. Sci. Technol. B 11(6), Nov./Dec. 1993, pp. 2502–2508.

Romankiw, L.T. et al., Interlayer Technique for Use to Form Evaporation Lift–Off Masks, IBM Technical Disclosure Bulletin, vol. 18, No. 12, May 1976.

White et al., "Use of Photosensitive Polymide for Deep X–Ray Lithography," Appl. Phys. Lett. vol. 66, No. 16, Apr. 17, 1995, pp. 2072–2073.

Communication from the European Patent Office dated Oct. 12, 2004 in corresponding application No. 02 001 998.

* cited by examiner

Primary Examiner—Amir Zarabian
Assistant Examiner—Christy Novacek
(74) Attorney, Agent, or Firm—Westerman, Hattori, Daniels & Adrian, LLP

(57) ABSTRACT

A method of fabricating a vertically profiled electrode like a T-gate 40 on a semiconductor substrate 20 is described. The method comprises providing a resist structure 34 on the substrate 20, the resist structure 34 containing at least a first resist pattern 24' arranged on the substrate 20 and having a first opening 26, the first resist being negative resist, and a second resist pattern 32 having a second opening 30 surrounding the first opening 26. The vertical profile of the gate electrode 40 is defined by the contours and the relative location of the first and the second opening 26, 30. On the resist structure 34 a metal 38 is deposited and lift-off is performed to remove the second resist 32 together with the metal 38 deposited thereon.

16 Claims, 8 Drawing Sheets

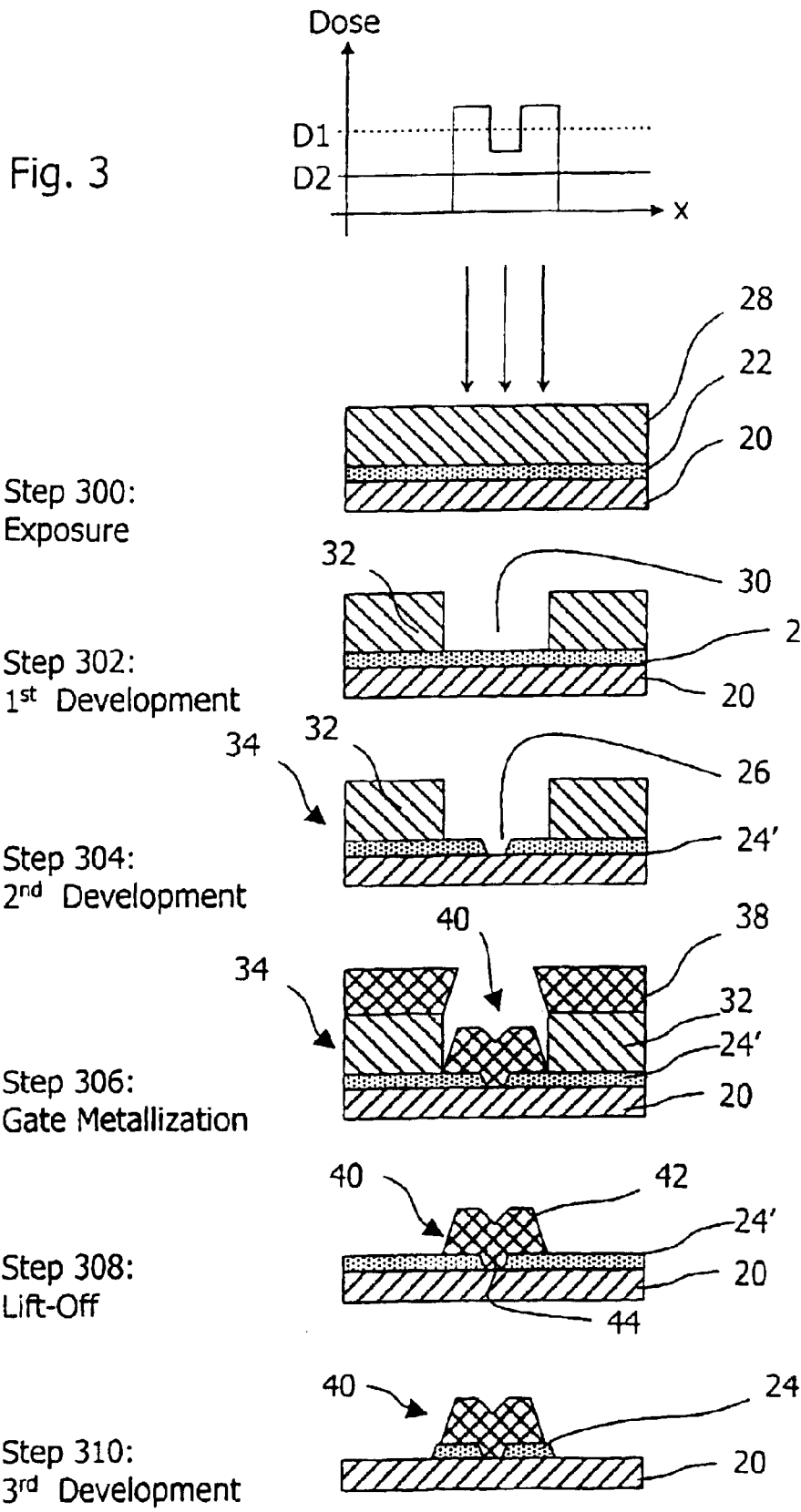

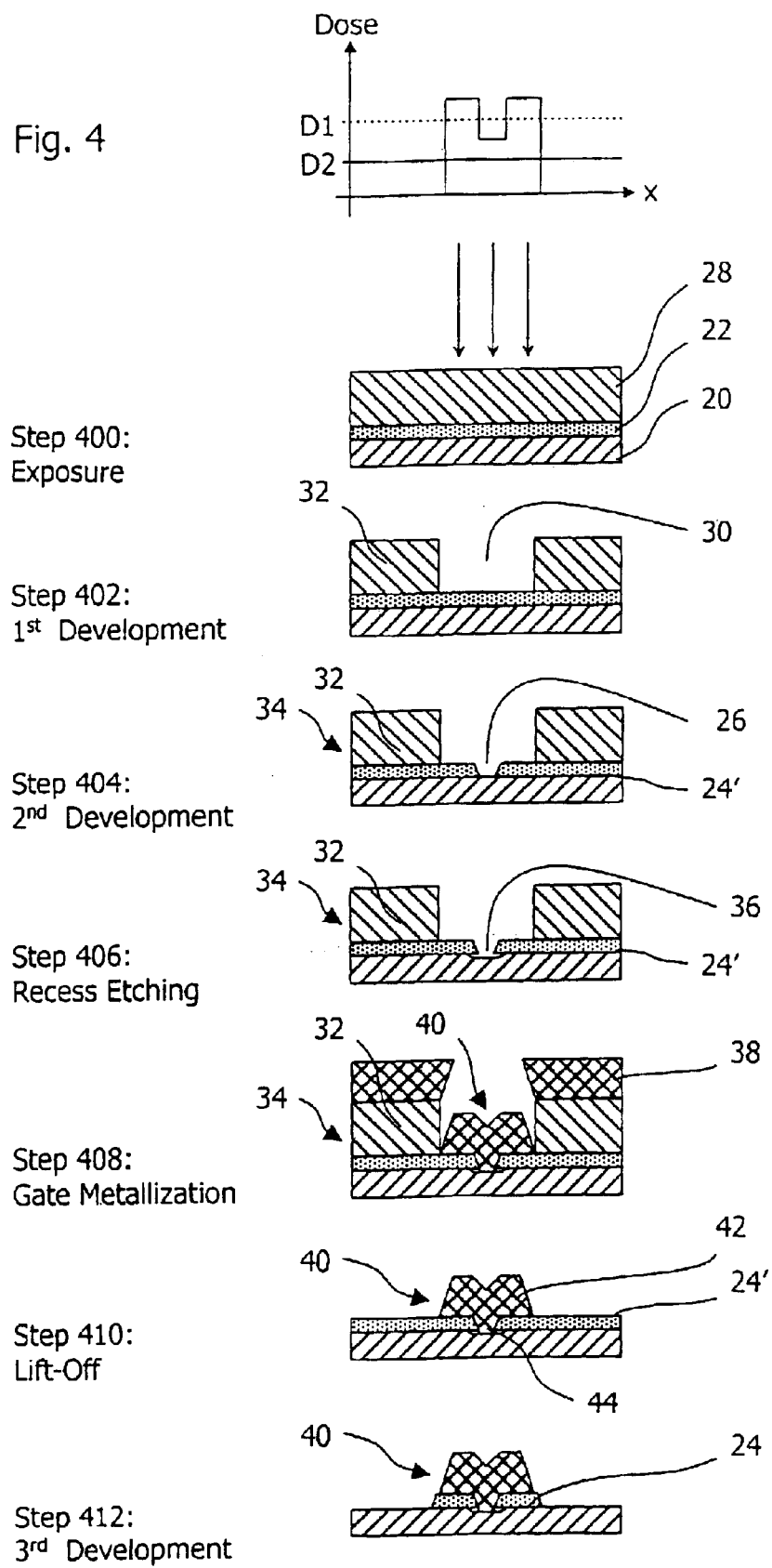

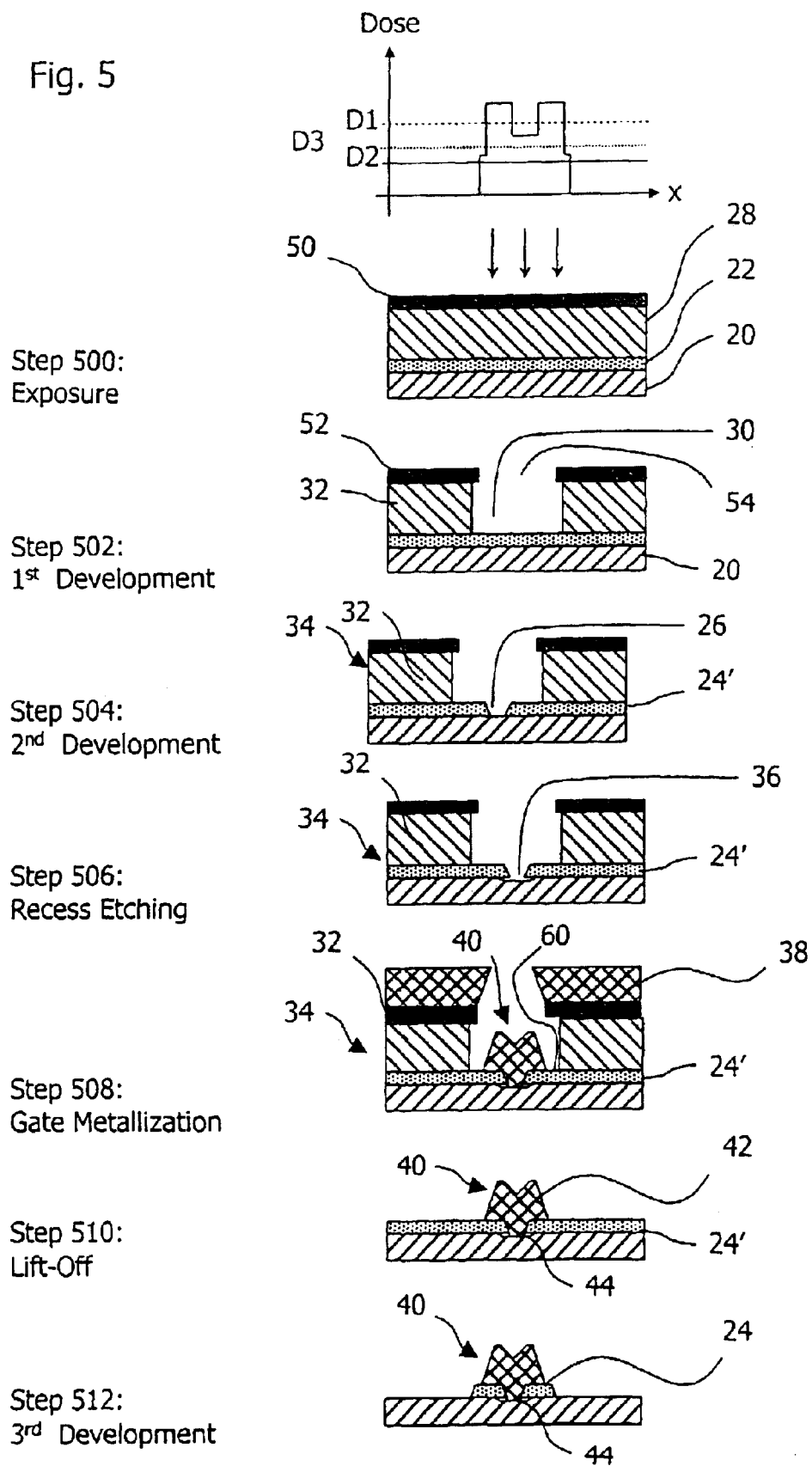

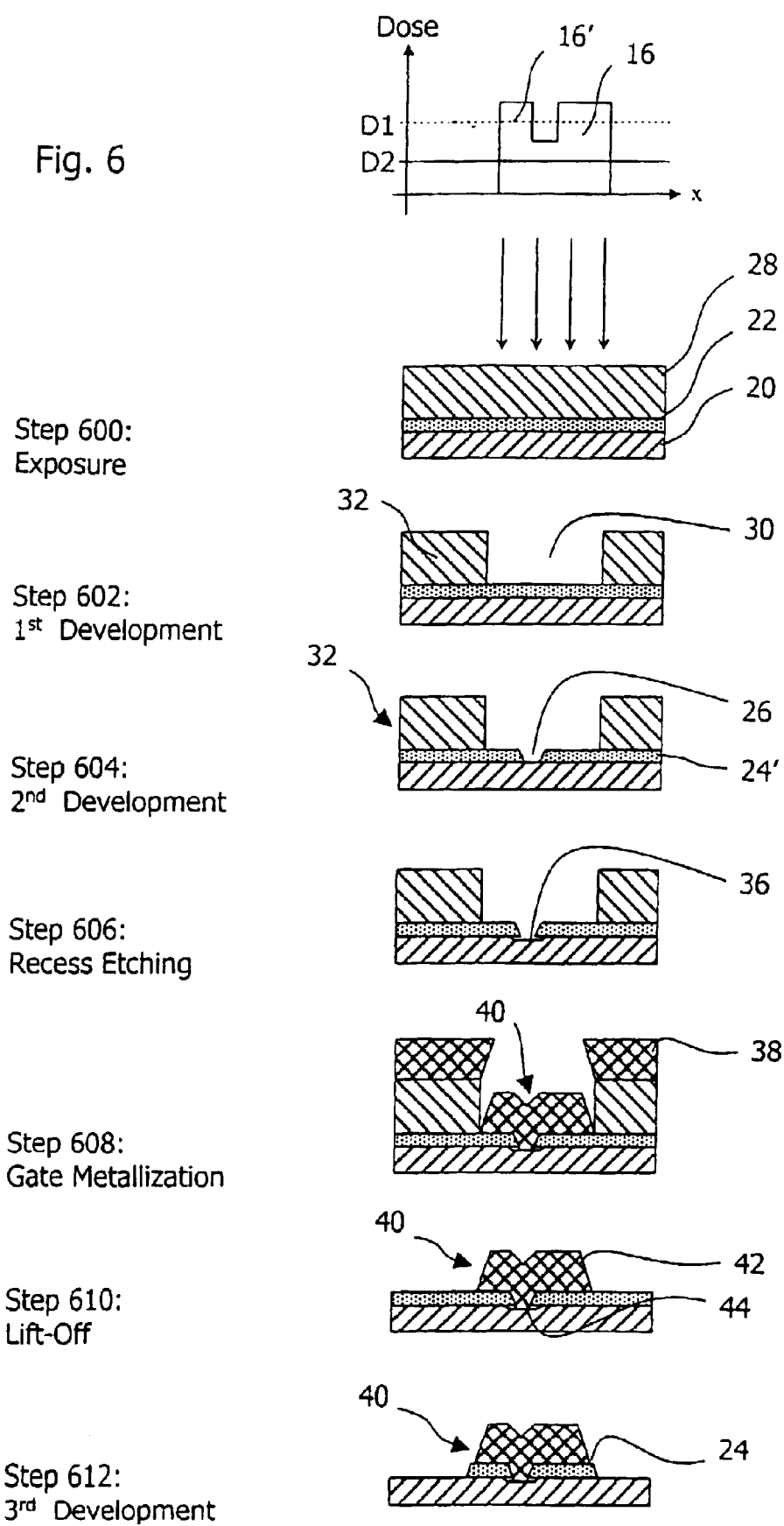

US 6,881,688 B2

METHOD OF FABRICATING A VERTICALLY PROFILED ELECTRODE AND SEMICONDUCTOR DEVICE COMPRISING SUCH AN ELECTRODE

BACKGROUND OF THE INVENTION

1. Technical Field

The invention relates to a method of fabricating an electrode on a semiconductor substrate. In particular, the invention concerns fabrication of a vertically profiled electrode like a T-gate or a Γ-gate. The invention further relates to a semiconductor device comprising such a vertically profiled electrode.

2. Description of the Prior Art

The rapid progress in material growth and device fabrication has greatly improved the performance of semiconductor devices like heterostructure field effect transistors in recent years. Such semiconductor devices were conventionally provided with gate electrodes having a triangular cross section. However, scaling down of the profile geometry of triangular-shaped gate electrodes with the intention to achieve shorter electron transit times leads to a strong increase of the gate end-to-end resistance. This not only deteriorates the high-frequency performance of the semiconductor device but also its power-gain cutoff frequency and its noise behavior.

In order to solve the problems associated with triangular-shaped gate electrodes, vertically profiled gate electrodes like T- or Γ-shaped gate electrodes (T- or Γ-gates) have been proposed. Vertically profiled gate electrodes in the form of T- or Γ-gates combine small footprints, i.e., short gate lengths, with large cross-sectional areas.

Fabrication methods and fabrication limits of T- or Γ-gates are exemplarily discussed in B. E. Maile "Fabrication limits of nanometer T- and Γ-gates: Theory and Experiment", J. Vac. Sci. Technol. B 11(6), November/December 1993, pages 2502 to 2508. In this article fabrication of T- and Γ-gates in the sub-100 nm regime using electron beam lithography, multi-layer resist stacks and lift-off is described.

During fabrication of the T- and Γ-gates a bilayer resist stack is arranged on the semiconductor substrate. The bilayer resist stack is exposed by way of electron beam lithography and then developed in order to locally open and vertically as well as horizontally pattern the resist stack. After the resist stack has been patterned, a gate metal is deposited on the patterned resist stack and a lift-off is performed to remove the patterned resist stack together with the gate metal deposited thereon.

The bilayer resist stack consists of a first resist layer (bottom resist) arranged on the semiconductor substrate and a second resist layer (top resist) arranged on the bottom resist. Both resist layers are formed from positive electron resists. In a positive electron resist, electron-polymer interaction taking place during exposure by the impinging electrons causes chemical bonds to be broken (chain scission) to form shorter molecular fragments. As a result, the molecular weight is reduced in the irradiated areas. The irradiated areas are later dissolved in a developer that attacks the low-molecular-weight material.

The T- and Γ-gate fabrication described above requires an electron dose profile as depicted in FIG. 1a. As can be seen from FIG. 1a, the electron dose profile consists of a quasi-line exposure 10 and an overlaid area exposure 12. The quasi-line exposure 10 defines the length of the gate in an x-direction and is also referred to as "core" exposure, whereas the overlaid area or "frame" exposure 12 defines the gate head. Changes of cross-sectional geometry, i.e., T- and Γ-shape, can easily be realized by changing the relative x-position of core and frame exposure.

As can be seen from FIG. 1a, the electron dose D1 required to expose the bottom resist is higher than the electron dose D2 for top resist exposure. This means that the sensitivity, which is defined as the electron dose required per unit area to give complete development, of the top resist is higher than the sensitivity of the bottom resist. Different resist sensitivities are necessary to control the vertical profiling of the gate electrode.

There is a need for a method of fabricating a vertically profiled electrode on a semiconductor substrate which allows a better control of the vertical electrode profile. There is also a need for a semiconductor device having such a vertically profiled electrode.

SUMMARY OF THE INVENTION

According to the invention a method of fabricating a vertically profiled electrode on a semiconductor substrate is proposed, the method comprising the step of providing on the substrate a resist structure with at least a first negative resist pattern arranged on the substrate and having a first opening and a second resist pattern having a second opening surrounding the first opening, the relative location of the first and the second opening defining a vertical profile of the electrode, and the further steps of depositing a metal on the resist structure, and of performing lift-off to remove the second resist pattern together with the metal deposited thereon.

Generally, the use of a negative resist as first resist has favorable implications for device fabrication and allows a better control of the vertical electrode profile. For example technological phenomena that conventionally, (i.e., when a positive resist is used as first resist) lead to an unwanted broadening of the gate length have the opposite effect when a negative resist is used. Thus a spreading of the dose or energy profile, an increase of the exposing beam diameter, of the exposure dose or, in the case of exposure by photons, of the exposure energy can be exploited to actually contribute to an effective reduction of the gate length and to faster semiconductor devices.

The second resist pattern may be arranged completely above the first resist pattern (resist stack) or adjacent to the first resist pattern directly on the substrate. Furthermore, the second resist pattern may be arranged partly above the first resist pattern and partly on the substrate.

The second opening in the second resist pattern is preferably larger than the first opening in the first resist pattern and may completely surround the first opening such that the resulting resist structure has a step-like profile in a vertical direction. In addition to the first and the second resist pattern the resist structure may comprise further resist patterns, preferably in the form of resist patterns arranged between the first and the second resist pattern or arranged for example with an overhang above the second resist pattern.

The resist structure may comprise electron resists or resists which are to be exposed by photons, like optical resists and X-ray resists. In the case the first resist is to be exposed by electron beam lithography, the first resist may comprise hydrogen silsesquioxane $(HSiO_{3/2})_n$ (HSQ). Furthermore, the resist structure may comprise a combination of different resists. For example the first resist may be a resist to be exposed by electrons and the second resist may be a resist to be exposed by photons or vice versa. In such a case two or more different exposure methods are used. Whereas the first resist is a negative resist, the second resist may be either a positive or negative resist.

The first resist pattern may remain completely or partially on the substrate, i.e., is preferably not totally removed during device fabrication. In such a case the first resist pattern may function as a kind of passivation layer. According to an especially preferred embodiment, the first resist remains at least in cavities arranged between the substrate and portions of the vertically profiled electrode. However, in some cases it might be advantageous to completely remove the first resist pattern during lift off or in a separate step thereafter.

The first resist may be a low-k dielectric, i.e., a dielectric having a low dielectric constant $\epsilon_r$. This is especially advantageous when the first resist pattern remains at least partially between an area of the substrate and the electrode because the low dielectric constant then leads to a reduction of device input and feedback capacities and improves device performance.

The first resist may be exposed using an inverted quasi-line energy or dose profile. A quasi-line is a line having limited extensions in two perpendicular directions, wherein the extension in one direction is much larger than the extension in the other direction. Such an energy or dose profile is especially advantageous if the electrode to be fabricated is a gate electrode. The exposed first resist may be developed using a selective developer. It can thus be ensured that the first resist can be developed separately from the second resist or any other resist used for electrode fabrication purposes. If necessary, the exposed second resist or any other exposed resist contributing the resist structure may also be developed using a selective developer.

The first and the second resist can be exposed either simultaneously or separately. If the first and the second resist are to be exposed simultaneously, the first resist may be arranged as a bottom resist on the substrate and the second resist may be arranged as a top resist on the first resist. On the other hand, if the first and the second resist are to be exposed separately, the first resist may be arranged on the substrate and developed prior to arranging the second resist on the first resist and/or on such areas of the substrate which have previously been opened by developing the first resist. The second resist may then be exposed separately from the first resist and developed in a subsequent development step.

The method discussed above allows fabrication of a semiconductor device comprising a substrate, a vertically profiled electrode arranged on the substrate, a cavity arranged between the substrate and the electrode, and a negative resist arranged in the cavity. The cavity may be constituted for example by a gap arranged between an upper surface of the substrate and the lower surface of the vertically profiled electrode facing the substrate.

The negative resist preferably fills the cavity at least to such an extent that the substrate remains covered in an area surrounding a contact area between the substrate and the electrode. More preferably, the negative resist is arranged such that the cavity remains hermetically sealed after deposition of the metal. Due to the comparatively high temperatures occurring during metal deposition the first resist may advantageously become hardened and tempered.

The negative resist, which may cover the substrate in an area outside the cavity or which may essentially be arranged only within the cavity, is preferably a dielectric having a dielectric constant $\epsilon_r<4,5$. The area of contact between the electrode and the substrate may be the bottom of an etched recess. This etched recess is preferably arranged under the negative resist.

BRIEF DESCRIPTION OF THE DRAWINGS

Further aspects and advantages of the invention will become apparent upon reference to the following detailed description of preferred embodiments and the drawings, wherein

FIGS. 3 to 6 show four further embodiments of a method of fabricating a vertically profiled gate electrode on a semiconductor substrate according to the invention.

DESCRIPTION OF PREFERRED EMBODIMENTS

In the following, the invention is exemplarily set forth with respect to a plurality of embodiments relating to the fabrication of T- or Γ-shaped gate electrodes on semiconductor substrates. However, the invention is neither restricted to the specific electrode types nor to the specific profiles nor to the specific resist types discussed below. In particular, although the following discussion mainly relates to electron resists, the invention could also be practiced using additionally or solely resists which are to be exposed by photons (e.g. deep-UV, extreme UV, X-rays) or focused ion beams. Moreover, although the following discussion primarily relates to resist structures comprising two or three different resists and generally U-shaped dose or energy profiles, more complex resist structures and dose or energy profiles can be used also in order to fabricate more sophisticated vertical profiles. Furthermore, although in the following the combined use of a negative resist and one or more positive resists is described, the invention could also be practiced using solely negative resists or two or more negative resists in combination with one or more positive resists.

Figure 1A:
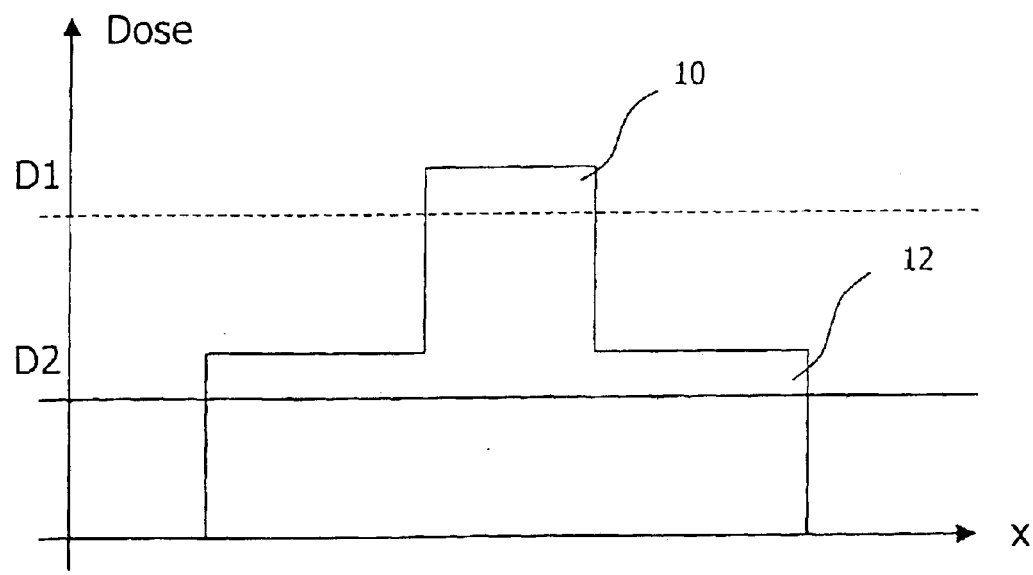
FIGS. 1a to 1d show the prior art dose profile (FIG. 1a) and dose or energy profiles according to exemplary embodiments of the invention (FIGS. 1b to 1d)
Figure 1B:
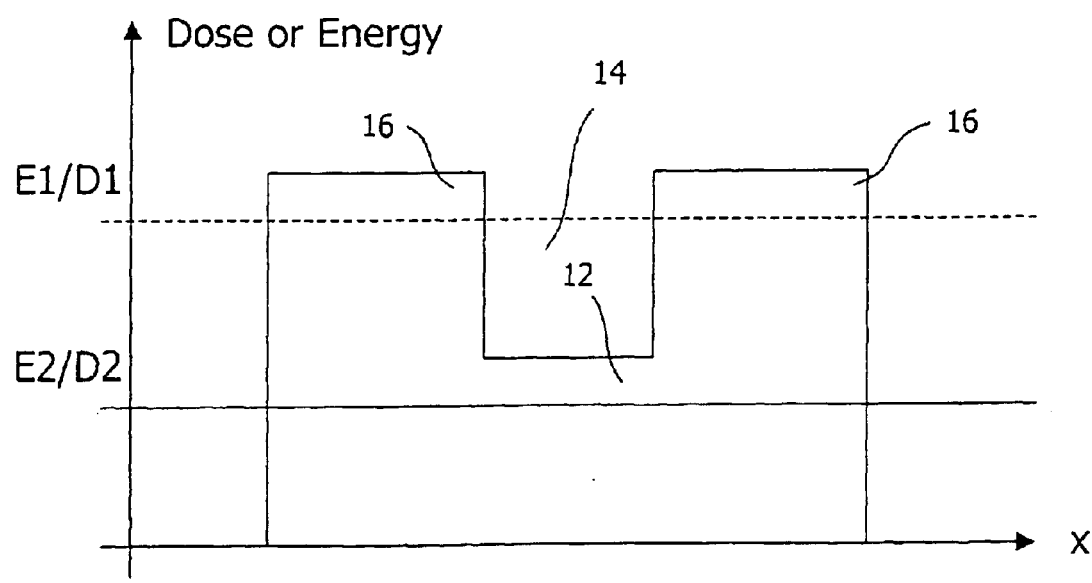
Figure 1C:
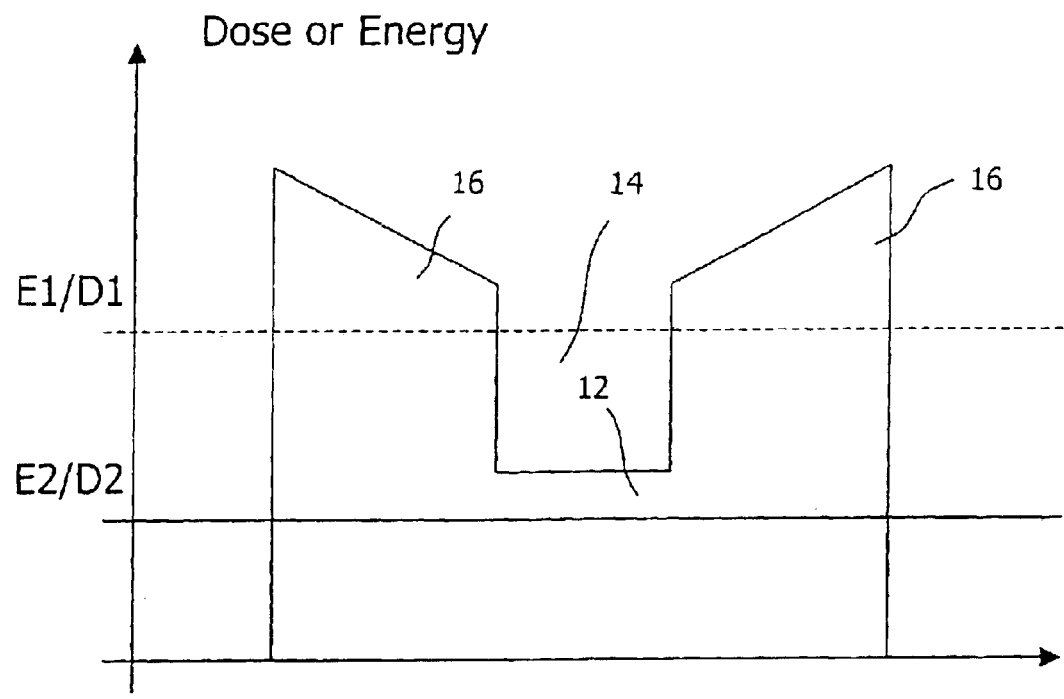
Figure 1D:
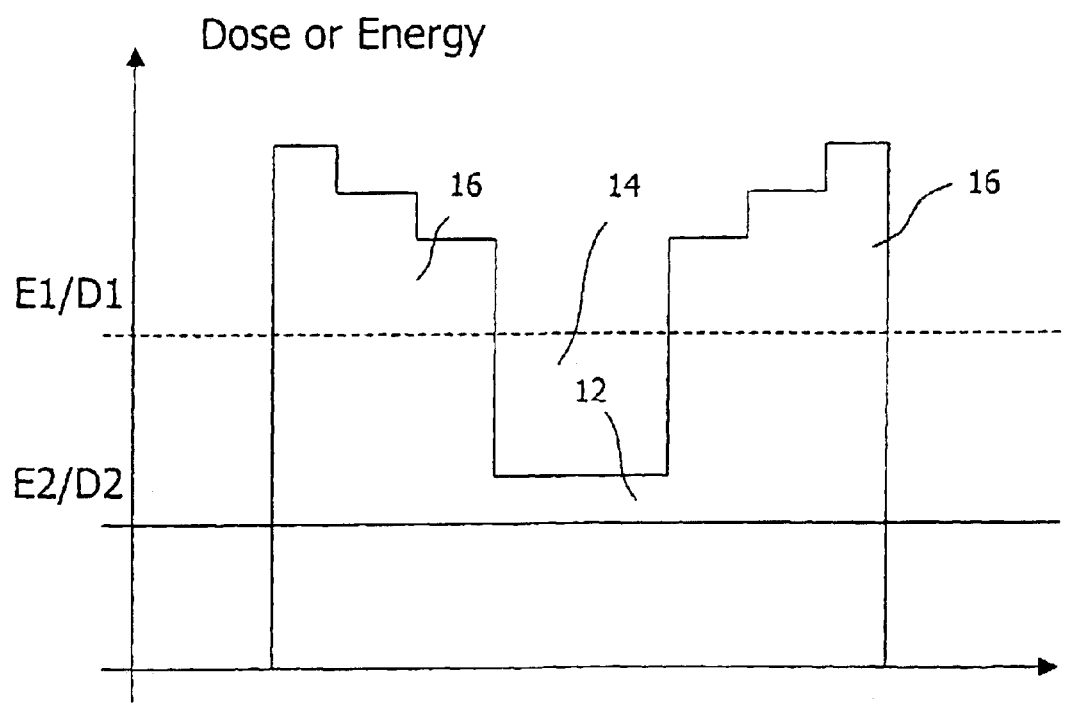

Typical dose or energy profiles according to the invention are exemplarily depicted in FIGS. 1b to 1d. The term "dose profile" applies when the resists are exposed by electron or ion beams, and the term "energy profile" applies when the resists are exposed by photons. In the case the resist structure is fabricated using a mix of different exposure mechanisms, separate dose and energy profiles would be involved. If for example fabrication of the resist structure comprises a resist exposed by electrons and a further resist exposed by photons, a mixed dose/energy profile could result.

The dose or energy profiles depicted in FIGS. 1b to 1d could be the result of a single exposure step or could be the accumulation of a plurality of exposure steps. The profiles depart from the assumption that a combination of a negative resist as bottom resist and a positive resist as top resist is used to realize the resist structure defining the vertical gate profile. The negative resist is used for structuring the gate foot and the positive resist is used for structuring the gate head. As has been mentioned above, however, an negative resist could be used also for structuring the gate head.

The dose or energy profiles depicted in FIGS. 1b to 1d deviate from the dose profile of FIG. 1a in that the exposure pattern of the "core" exposure 10 is inverted. In other words, the gate foot is defined by an inverted quasi-line exposure. In the cross section along the x-axis such an inverted quasi-line exposure has a local dose or energy minimum 14 at the position of the gate foot. The local minimum 14 is surrounded by two peaks 16 which lie above the critical energy E1 or the critical dose D1 required to expose the negative resist. The inverted quasi-line exposure defining the gate foot is combined with a frame exposure 12 which defines the shape of the gate head in the positive resist. The positive resist has a comparatively higher sensitivity (E2/D2).

As a result of the inverted quasi-line exposure of the negative resist, any broadening of the peaks 16 due to an increase of an exposure dose or exposure energy or due to a broadening of the beam diameter leads to a narrowing of the local minimum 14. Such a narrowing results in a reduced gate length and faster devices. On the other hand, a broadening of the peak 10 of the prior art quasi-line exposure depicted in FIG. 1a results in an increased gate length and leads to a reduced device speed.

The two or more dose or energy profile peaks 16 may be flat as shown in FIG. 1b. They alternatively may have a more complex shape and may even be asymmetric in order to generated a tailored profile of the negative resist. This allows for an optimization of the shape of the gate electrode in the foot region, further enhancing device speed and lift-off yield. Two exemplary asymmetric peak profiles are depicted in FIGS. 1c and 1d. As can be gathered from FIGS. 1c and 1d, the asymmetric peaks 16 have a dose or energy profile that linearly (FIG. 1c) or stepwise (FIG. 1d) decreases towards the local minimum 14.

In the following several methods of fabricating T- and Γ-gates on a semiconductor substrate using total dose profiles similar to the dose profile depicted in FIG. 1b will exemplarily be described for electron resists.

Figure 2A:
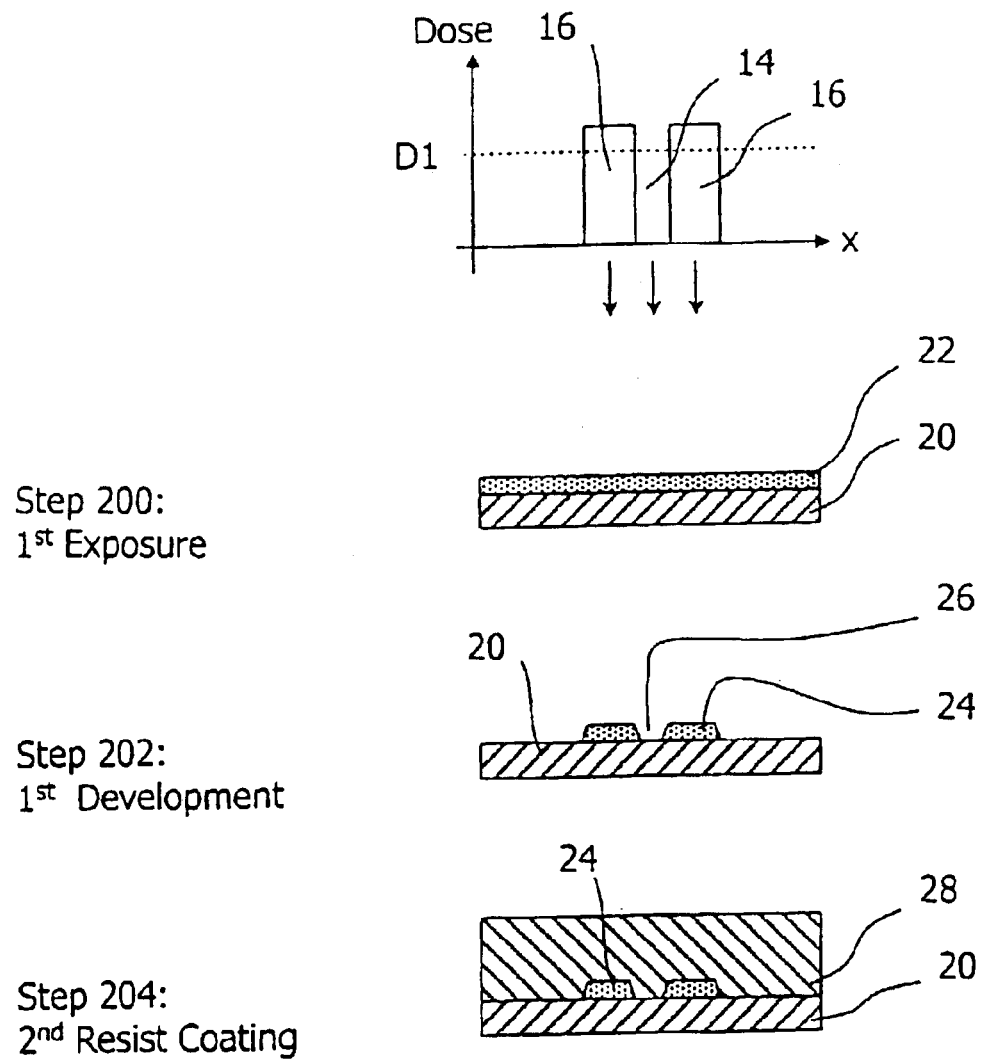
FIGS. 2a, 2b show a first embodiment of a method of fabricating a vertically profiled gate electrode on a semiconductor substrate according to the invention.
Figure 2B:
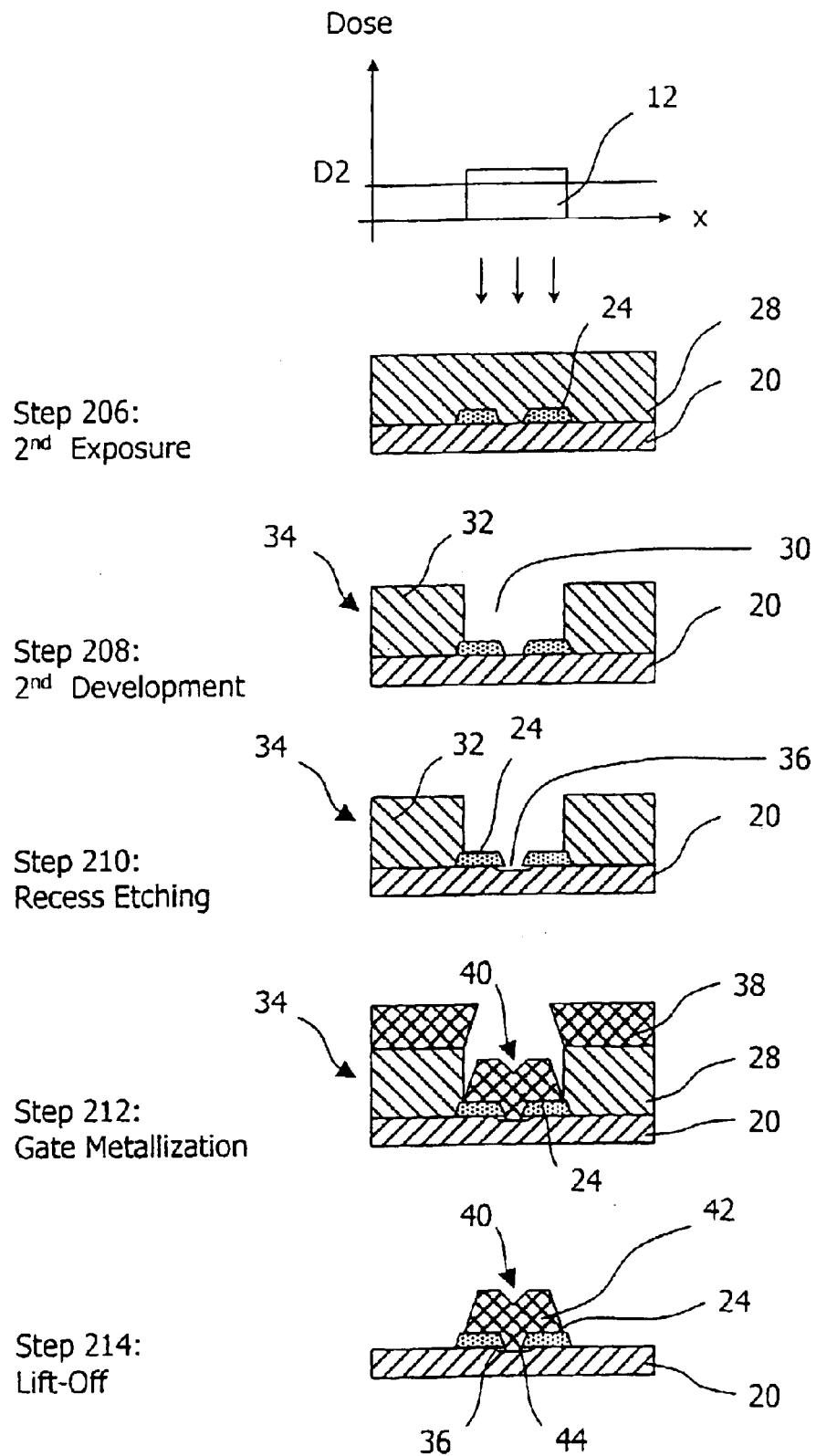

Referring to FIGS. 2a and 2b, fabrication of a recessed T-gate using two separate exposure steps will now be explained in more detail. In a first step depicted in FIG. 2a, a substrate 20 is coated with a layer 22 of a negative resist. The negative resist layer 22 has a thickness between 40 nm and 300 nm, preferably between 80 nm and 150 nm. The negative resist arranged on the substrate 20 is an ordered three-dimensional polymer like hydrogen silsesquioxane (HSQ). HSQ is a negative electron-beam resist having a low dielectric constant. In B. E. Maile et al, Sub-10 nm Linewidth and Overlay Performance Achieved with a Fine-Tuned EBPG-5000 TFE Electron Beam Lithography System, Jpn. J. Appl. Phys. Vol. 39 (2000), pages 6836 to 6842, herein incorporated by reference as far as HSQ processing is concerned, HSQ is mentioned as a test vehicle for electron beam system testing and benchmarking.

During a first electron beam exposure step 200 the negative resist arranged on the substrate 20 is exposed using an inverted quasi-line-dose profile as depicted in FIG. 2a. The dose profile of FIG. 2a consists of two peaks 16 surrounding a local minimum 14. The electron beam used to expose the negative resist can be a gaussian beam or a shaped beam.

In the negative resist layer 22 the electron irradiation of step 200 causes irradiation-induced polymer cross linking. The cross linking creates a complex three dimensional structure with a higher molecular weight than said of the non-irradiated resist. The non-irradiated resist can thus be dissolved in step 202 using a developer like tetramethylammoniumhydroxide (TMAH) that does not attack the irradiated high-molecular-weight material.

During the first development step 202 the negative resist is removed in all areas that have not been irradiated in step 200. Consequently, the negative resist pattern 24 remaining on the substrate 20 has locally the form of an inverted quasi-line pattern. Such an inverted quasi-line pattern comprises a central opening 26 in the form of a quasi-line, i.e., a line having limited extensions, the contours of which are defined by the negative resist pattern 24 remaining on the substrate 20. The opening 26 defines the form of the gate foot and in particular the gate length.

After the negative resist has been developed, the substrate 20 and the negative resist pattern 24 arranged thereon are coated with a positive resist in step 204 to form a positive resist layer 28 covering the substrate 20 and the negative resist pattern 24. The positive resist layer 28 may have a thickness between 200 nm and 2000 nm, preferably between 400 nm and 1000 nm. In the following it will be assumed that the positive resist is an electron resist like polymethylmethacrylate (PMMA) or another polymer which functions as positive resist. In principle, however, the following steps could also be performed if the positive resist was a resist to be developed by photons.

Referring now to FIG. 2b, the positive resist is exposed in step 206 using a frame exposure dose profile 12 as depicted in FIG. 2b. The frame exposure defines the shape and the position of the gate head. A superposition of the dose profile used during the first exposure step 200 (FIG. 2a) and the dose profile used in the second exposure step 206 (FIG. 2b) corresponds to the dose profile depicted in FIG. 1b.

After the positive resist has been exposed, a second development step 208 is performed to open the areas irradiated by electrons. For developing purposes, mixtures of methylisobutylketone (MIBK) and isopropanol (IPA) may be used.

During the second development step 208 the positive resist layer 28 is patterned such that an opening 30 is created. This opening 30 in the developed positive resist pattern 32 surrounds the opening 26 in the negative resist pattern 24. The negative resist pattern 24 and the positive resist pattern 32 together define a resist structure 34 having a symmetric, step-like vertical profile. As will become apparent from the discussion below, the contours and the relative location of the opening 26 in the negative resist pattern 24 and the opening 30 in the positive resist pattern 32 will define the vertical profile of the gate electrode.

It can be seen from FIG. 2b that the positive resist pattern 32 is arranged adjacent to the negative resist pattern 24 such that the substrate 20 is only accessible via the opening 26 in the negative resist pattern 24. In other words, there is no gap between the positive resist pattern 32 and the negative resist pattern 24. Furthermore, it should be noted that the negative resist pattern 24 could have been provided with a plurality of for example parallel quasi-line openings 26 and the opening 30 in the positive resist pattern 32 could have been arranged such that it surrounds this plurality of openings 26 in the negative resist pattern 24. Thus a gate structure having a single gate head and a plurality of gate feet can be fabricated.

After the positive resist layer 28 has been opened as depicted in FIG. 2b, recess etching is performed in step 210 to etch a recess 36 into the substrate 20 through the opening 30 in the positive resist pattern 32 and the opening 26 in the negative resist pattern 24. Recess etching may be performed for example wet-chemically or using a plasma.

After recess etching has been performed, a gate metal like Ti/Pt/Au or Al is deposited on the resist structure 34 and the substrate 20 in step 212. Gate metal deposition can be performed by evaporation, sputtering, etc.

During gate metal deposition most of the gate metal will be deposited as a layer 38 on the positive resist pattern 32. However, some gate metal will enter the opening 30 in the positive resist pattern 32 and will thus be deposited on the open surfaces of the negative resist pattern 24 and, through the opening 26 in the negative resist pattern 24, on the substrate 20. The gate metal deposited on the negative resist pattern 24 and the substrate 20 forms a gate electrode 40.

In a last step 214, lift-off is performed in an organic solvent like acetone or dimethyl-formamid (DMF). During lift-off, the positive resist pattern 32 together with the gate metal layer 38 deposited thereon are removed. The structure remaining on the substrate 20 after lift-off comprises the gate 40 with its gate head 42 and its gate foot 44 as well as the negative resist pattern 24. This means that during device fabrication the negative resist pattern 24 is not removed but remains in an otherwise empty cavity between the upper surface of the substrate 20 and a lower surface of the gate head 42 facing the substrate 20.

The negative resist pattern 24 thus hermetically seals the gate electrode 40 and the recess 36. This not only improves device reliability but also facilitates further processing of the device. Moreover, since the negative resist which fills the cavity is HSQ, i.e., a negative resist having a low dielectric constant, device operation is improved due to reduced input and feedback capacities.

In the following four further embodiments of the invention will be described with reference to FIGS. 3 to 6. Since the materials and processes used in the further embodiments are to a large extent identical with those discussed in conjunction with the embodiment depicted in FIGS. 2a and 2b, an in-depth discussion of the processes and materials will be omitted. Instead, only the differences will be discussed in more detail. The embodiments depicted in FIGS. 3 to 6 generally deviate from the embodiment depicted in FIGS. 2a and 2b in that the positive resist and the negative resist are exposed simultaneously and in that the positive resist layer 28 is arranged on the negative resist layer 22 prior to exposure.

Referring now to FIG. 3, a resist stack comprising a negative resist layer 22 and a positive resist layer 28 is arranged on the substrate 20. The two resists are simultaneously exposed in step 300 using the dose profile depicted in FIG. 1b. After exposure a first development step 302 is performed to create the positive resist pattern 32 including the opening 30. Since in the embodiment of FIG. 3 the negative resist will be developed using a selective developer, the negative resist layer 22 is not yet opened during the first development step 302. Instead, a selective second development step 304 has to be performed to open the negative resist layer 22 and to create a negative resist pattern 24' including an opening 26. It should be noted that the non-irradiated areas of the negative resist layer 22 which are arranged under the positive resist pattern 32 are not removed during the second development step 304. The reason for this is the fact that the positive resist pattern 22 functions as mask and allows removal of the negative resist only through the opening 30 of the positive resist pattern 32.

In the embodiment depicted in FIG. 3 no recess etching is performed. The gate metal is thus deposited on the resist structure 34 in a step 306 following the second development step 304.

After gate metal deposition a lift-off is performed in step 308 as explained above in conjunction with FIG. 2b. During lift-off only the positive resist pattern 32 together with the gate metal layer 38 deposited thereon is removed. The negative resist pattern 24' remains on the substrate 20 and essentially covers the whole substrate 20 except for a small area of contact ("foot print") between the gate electrode 40 and the substrate 20.

According to a first variant of the invention the negative resist pattern 24' remains as a protective layer on the substrate 20. According to a second variant of the invention a facultative third development step 310 is performed after lift-off to remove the remaining parts of the negative resist pattern 24' that have not been exposed during the exposure step 300 and that were masked by the positive resist pattern 32 during the second development step 304. The negative resist pattern 24 created during the third development step 310 corresponds to the negative resist pattern depicted in FIG. 2b (step 214). According to a third variant of the invention, the negative resist pattern 24', including the negative resist in the cavity between the gate head 42 and the substrate 20, is completely removed, for example by means of a plasma.

A method of fabricating a T-gate 40 on a semiconductor substrate 20 according to a third embodiment of the invention is depicted in FIG. 4. The embodiment depicted in FIG. 4 is based on the embodiment shown in FIG. 3 and comprises an additional recess etching step 406 prior to the deposition of the gate metalization in step 408.

A method of fabricating a T-gate 40 according to a fourth embodiment of the invention is shown in FIG. 5. According to the fourth embodiment, the semiconductor device 20 is fabricated using a trilayer resist stack comprising a HSQ negative resist bottom layer 22 arranged on the substrate 20, a positive resist mid layer 28 arranged on the bottom layer 22 and a positive resist top layer 50 arranged on the positive resist mid layer 28.

The top layer 50 has a thickness between 20 nm and 500 nm, preferably between 50 nm and 200 nm, and is formed from PMMA or another polymer that can act as a positive resist. The mid layer 28 has a thickness between 150 nm and 1500 nm, preferably between 300 nm and 900 nm, and is formed from poly(methylmetacrylate/methacrylic acid)-copolymer (P(MMA/MAA)) or another polymer or copolymer that can function as a positive resist.

The positive resist of the mid layer 28 is chosen such that it has a higher sensitivity than the positive resist of the top layer 50. This can be gathered from the (modified) dose profile depicted in FIG. 5. The combination of three different sensitivities allows to create a recessed resist structure and to thus improve the lift-off yields as will be discussed below.

After the trilayer resist stack depicted in FIG. 5 has been exposed in step 500 using the modified dose profile, a first development step 502 is performed in order to develop the top resist 50 and the mid resist 28 simultaneously (separate development steps could be used as well). Since the positive resist of the mid layer 28 has a higher sensitivity than the positive resist of the top layer 50, and due to the modified dose profile, the first development step 502 creates a top resist pattern 52 which has an overhang relative to the mid resist pattern 32. This overhang is due to the fact that an opening 54 created in the top resist layer 50 during the first development step 502 is smaller than an opening 30 created in the mid resist layer 28. In other words, the mid resist pattern 32 is recessed with respect to the top resist pattern 52.

During deposition of the gate metal in step 508 the overhanging top resist pattern 52 allows to control the lateral spacing 60 between the gate electrode 40 and the mid resist pattern 32. This controllable spacing 60 increases the lift-off yields because the organic solvent has an improved lateral access to the mid resist pattern 32. Furthermore, the overhang allows likewise to control the spacing between the gate electrode 40 and laterally neighboring electrodes, e.g. source and drain electrodes, not depicted in FIG. 5.

A method of fabricating a Γ-shaped gate electrode on a substrate 20 according to a fifth embodiment of the invention is depicted in FIG. 6. As can be gathered from the dose profile shown in FIG. 6, the two dose peaks 16, 16' surrounding the local dose minimum 14 have a different lateral dimension in x-direction. This means that unlike the T-gate electrodes discussed above in context with the previous embodiments, the gate foot 44 is no longer arranged in the middle of the gate head 42. As can be seen from FIG. 6, the gate foot 44 is shifted relative to the gate head 42 to the left. Apart from this difference the embodiment depicted in FIG. 6 corresponds to the embodiment discussed above in conjunction with FIG. 4.

What is claimed is:

1. A method of fabricating a vertically profiled electrode on a semiconductor substrate, comprising:
    a) providing a resist structure on the substrate, the resist structure containing at least
        a first resist pattern arranged on the substrate and having a first opening, the first resist being a negative resist, and
        a second resist pattern having a second opening surrounding the first opening, the relative location of the first and the second opening defining a vertical profile of the electrode;
    b) depositing a metal on the resist structure; and
    c) performing lift-off to remove the second resist pattern together with the metal deposited thereon, wherein the first resist pattern remains at least partially on the substrate in an area adjacent to or under the electrode.

2. The method of claim 1, wherein the first resist comprises hydrogen silsesquioxane or another electron resist.

3. The method of claim 1, wherein the first resist pattern remains at least partially on the substrate in an area adjacent to and under the electrode.

4. The method of claim 1, wherein step a) comprises exposing the negative resist using an inverted quasi-line energy or dose profile.

5. The method of claim 1, wherein step a) comprises exposing the first and the second resist separately.

6. The method of claim 1, wherein step a) comprises exposing the first and the second resist simultaneously.

7. The method of claim 1, wherein the resist structure contains a third resist pattern arranged on the second resist pattern and having an overhang relative to the second resist pattern.

8. The method of claim 1, further comprising the step of d) developing the first resist pattern.

9. The method of claim 1, wherein the second resist pattern is made from a positive resist.

10. The method of claim 1, wherein the second resist pattern is made from a negative resist.

11. A semiconductor device comprising:
    a substrate;
    a vertically profiled electrode arranged on the substrate;
    a cavity arranged between the substrate and the electrode; and
    a patterned negative resist that is arranged at least partially in the cavity and that has not been removed during device fabrication.

12. The semiconductor device of claim 11, wherein the negative resist comprises hydrogen silsesquioxane or another electron resist.

13. The semiconductor device of claim 11, wherein the negative resist has a dielectric constant $\epsilon_r < 4,5$.

14. The semiconductor device of claim 11, wherein the negative resist covers the substrate in an area outside the cavity.

15. The semiconductor device of claim 11, wherein an area of contact between the electrode and the substrate is arranged in an etched recess.

16. The semiconductor device of claim 11, wherein the negative resist arranged in the cavity has an inverted quasi-line pattern.

* * * * *